(12) United States Patent
Cao

(10) Patent No.: US 6,674,116 B1
(45) Date of Patent: Jan. 6, 2004

(54) VARIABLE CAPACITOR USING MOS GATED DIODE WITH MULTIPLE SEGMENTS TO LIMIT DC CURRENT

(75) Inventor: Min Cao, Mountain View, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 58 days.

(21) Appl. No.: 09/683,709

(22) Filed: Feb. 5, 2002

Related U.S. Application Data

(63) Continuation-in-part of application No. 09/682,993, filed on Nov. 6, 2001.

(51) Int. Cl.$^7$ .................. H01L 27/108; H01L 29/76; H01L 29/94; H01L 31/119
(52) U.S. Cl. ........................... 257/312; 257/595
(58) Field of Search ..................... 257/312, 595, 257/313, 299

(56) References Cited

U.S. PATENT DOCUMENTS

| | | | |
|---|---|---|---|
| 3,562,608 A | * 2/1971 | Gallagher et al. | ........... 257/312 |
| 3,812,517 A | 5/1974 | Sato et al. | ..................... 357/23 |
| 4,021,788 A | 5/1977 | Marr | .......................... 340/173 |
| 4,499,387 A | 2/1985 | Konishi | ....................... 307/443 |
| 4,642,580 A | 2/1987 | Scott | ........................... 331/117 |
| 5,055,889 A | 10/1991 | Beall | ........................... 357/14 |
| 5,173,835 A | 12/1992 | Cornett et al. | ............... 257/310 |
| 5,220,194 A | 6/1993 | Golio et al. | ................. 257/601 |
| 5,248,948 A | 9/1993 | Shiga | .......................... 331/96 |
| 5,600,187 A | 2/1997 | El-Hamamsy et al. | ....... 307/157 |
| 5,747,865 A | 5/1998 | Kim et al. | ................... 257/480 |
| 5,965,912 A | 10/1999 | Stolfa et al. | ................. 257/312 |
| 6,172,378 B1 | 1/2001 | Hull et al. | ..................... 257/14 |
| 6,211,745 B1 | 4/2001 | Mucke et al. | ................ 331/117 |
| 6,242,989 B1 | 6/2001 | Barber et al. | ................ 331/177 |
| 6,268,779 B1 | 7/2001 | van Zeijl | ..................... 331/117 |
| 6,400,001 B1 | * 6/2002 | Manzini et al. | ............. 257/601 |

* cited by examiner

*Primary Examiner*—Phat X. Cao
(74) *Attorney, Agent, or Firm*—Stuart T. Auvinen

(57) ABSTRACT

A voltage-variable capacitor uses the channel-to-substrate junction from a gated diode formed from a metal-oxide-semiconductor transistor. The transistor gate has at least two contacts that are biased to different voltages. The gate acts as a resistor with current flowing from an upper gate contact to a lower gate contact. The gate-to-source voltage varies as a function of the position. A critical voltage is where the gate-to-source voltage is equal to the transistor threshold. A portion of the gate that has gate voltages above the critical voltage has an inversion layer or conducting channel under the gate. Another portion of the gate has gate voltages below the critical voltage, and thus no channel forms. By varying either the gate voltages or the source voltage, the area of the gate that has a channel under it is varied, varying the channel-to-substrate capacitance. Separate gate arms reduce bias current.

8 Claims, 8 Drawing Sheets

VARIABLE CAPACITOR USING MOS GATED DIODE WITH MULTIPLE SEGMENTS TO LIMIT DC CURRENT

CROSS REFERENCE TO RELATED APPLICATIONS

This application is a continuation-in-part of the co-pending application for MOS Variable Capacitor with Controlled dC/dV and Voltage Drop Across W of Gate, U.S. Ser. No. 09/682,993, filed Nov. 6, 2001.

BACKGROUND OF INVENTION

This invention relates to integrated circuit capacitors, and more particularly to voltage-variable integrated capacitors.

Variable capacitors or varactors have been used for many years in tuning circuits. For example, radio receivers once used variable capacitors that adjusted a band-pass frequency in a tuning circuit, allowing one radio station to be amplified while suppressing other radio frequency signals. The amount of capacitance was varied by a user turning a dial that rotated half of the metal plates of the capacitor. As the user rotated the plates, the overlap area between adjacent metal plates varied, thus varying the capacitance value. FIG. 1A shows a symbol for a variable capacitor or varactor.

More recently, capacitors have been integrated onto larger integrated circuit (IC) chips. Often a capacitor is formed from a metal-oxide-semiconductor (MOS) field-effect transistor. FIG. 1B shows a prior-art MOS capacitor. The source and drain terminals of the MOS transistor are shorted together and form one terminal ND of the capacitor, with the MOS transistor's gate forms the second capacitor terminal NG. The very thin gate oxide provides a large capacitance value in a small area.

The capacitance can be varied by changing the size of the MOS transistor. The circuit designer can select the desired capacitance by selecting the W and L values of the capacitor-transistor. However, once the circuit is manufactured, the capacitance is fixed.

A variable capacitor can be made by including several capacitors in parallel on the IC chip. An array of switches or pass transistors can selectively couple the parallel capacitors to a circuit node. Electronic signals can be applied to the gates of some of the pass transistors to electronically connect the selected capacitors to the circuit node. Other electronic signals can turn off other pass transistors, disconnecting their capacitors from the circuit node. As more of the parallel capacitors are connected to the circuit node, the capacitance increases. Thus the total capacitance attached to the circuit node can be electronically selected. The electronic signals can be coded binary signals such as a thermometer code.

While such a binary-controlled variable capacitor is useful, an analog-voltage controlled variable capacitor is desired. A variable capacitor that changes its capacitance value based on an applied voltage can allow for a wider range of capacitances, rather than a limited quanta of capacitances selected by binary control signals. What is desired is a voltage-variable capacitor that can be integrated with circuits using common MOS processes.

The parent application disclosed such an analog-controlled variable capacitor using a MOS transistor. A voltage gradient was applied across the source and across the drain, so that the source acted as a resistor, and the drain acted as another resistor. The variable capacitance was from the gate to the channel. However, one of the two nodes of the variable capacitor was the source/drain, which also had the voltage gradient and a current flow. It is desirable to have the voltage gradient applied to a third node that is separate from the two nodes of the variable capacitor.

What is desired is to have the variable capacitance from the channel to the substrate, but under control of the gate. A variable capacitor using a gated-diode is desired.

DETAILED DESCRIPTION

The present invention relates to an improvement in voltage-variable capacitors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
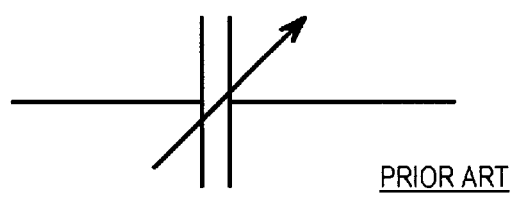
FIG. 1A shows a symbol for a variable capacitor or varactor.
Figure 1B:
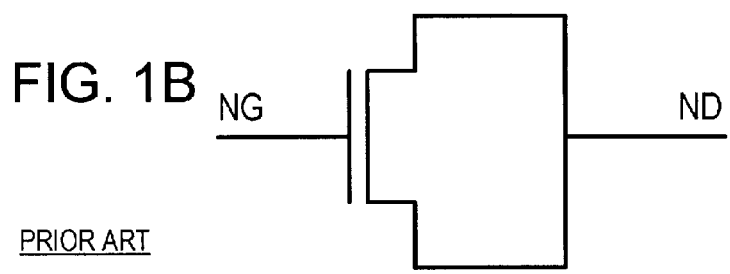
FIG. 1B shows a prior-art MOS capacitor.
Figure 2A:
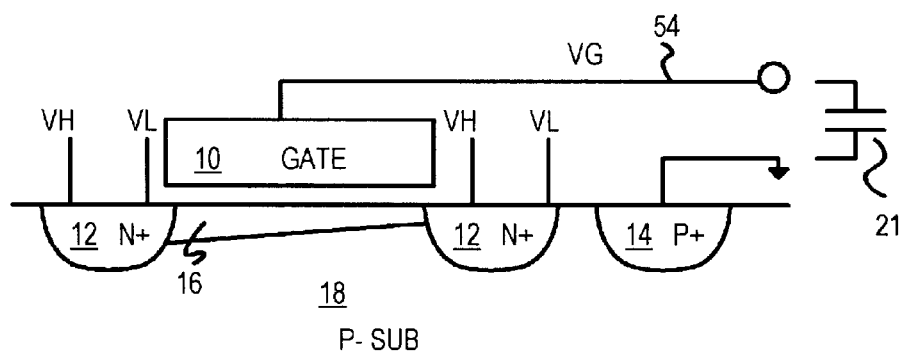
FIG. 2A shows a cross-section of a MOS transistor used as a variable capacitor.

FIG. 2A shows a cross-section of a MOS transistor used as a variable capacitor. A bias voltage applied to gate 10 causes an inversion layer or channel 16 to form in substrate 18 under gate 10. This allows current to flow between drain and source 12 in a typical transistor. Substrate tap 14 is a p+ region that can be used to bias substrate 18 to ground or another potential.

In the parent application, the variable capacitance 21 was the gate-to-channel capacitance, from gate 10 to channel 16. The potential of channel 16 varied in the W direction (perpendicular to the plane of the drawing) since the potential of source 12 varied along the source. In a typical transistor, source 12 is biased to a constant potential that is the same everywhere within source 12. Unlike the typical transistor, the parent application set up a voltage gradient across the source itself, so that the source acted like a resistor.

Figure 2B:
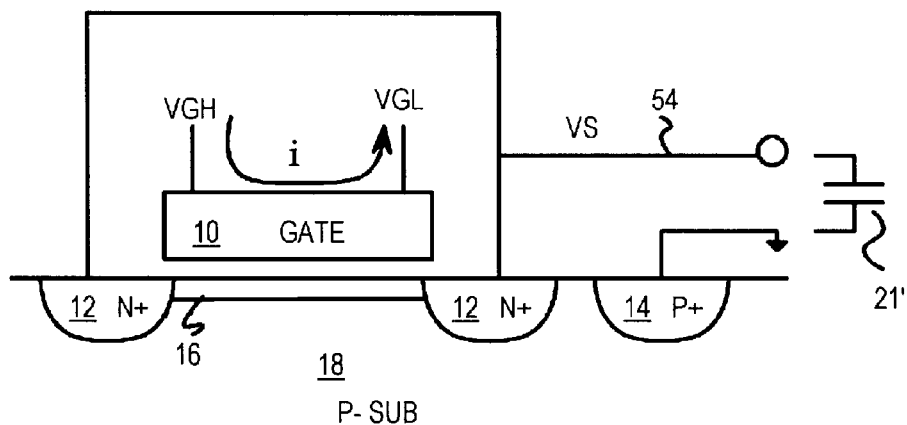
FIG. 2B shows a cross section of a gated diode used as a variable capacitor.

FIG. 2B shows a cross section of a gated diode used as a variable capacitor. The inventor also realizes that the voltage gradient (VGH-VGL) can be applied across the gate, with the gate acting as a resistor. Current i flows through gate 10, from VGH to VGL. The capacitance adjusted is between channel 16 and substrate 18. Drain and source 12 set a nominal potential of channel 16. Substrate tap 14 controls the potential of substrate 18, which is typically grounded.

However, the potential of gate 10 affects channel 16. The MOS transistor acts as a gated diode, with gate 10 controlling the formation of channel 16. By placing a voltage gradient along gate 10, the channel area and capacitance can be varied. Thus the variable capacitance 21' is from channel 16 to substrate 18, but is controlled by bias voltages VGH and VGL on gate 10, and the source/drain voltage VS.

Figure 3:
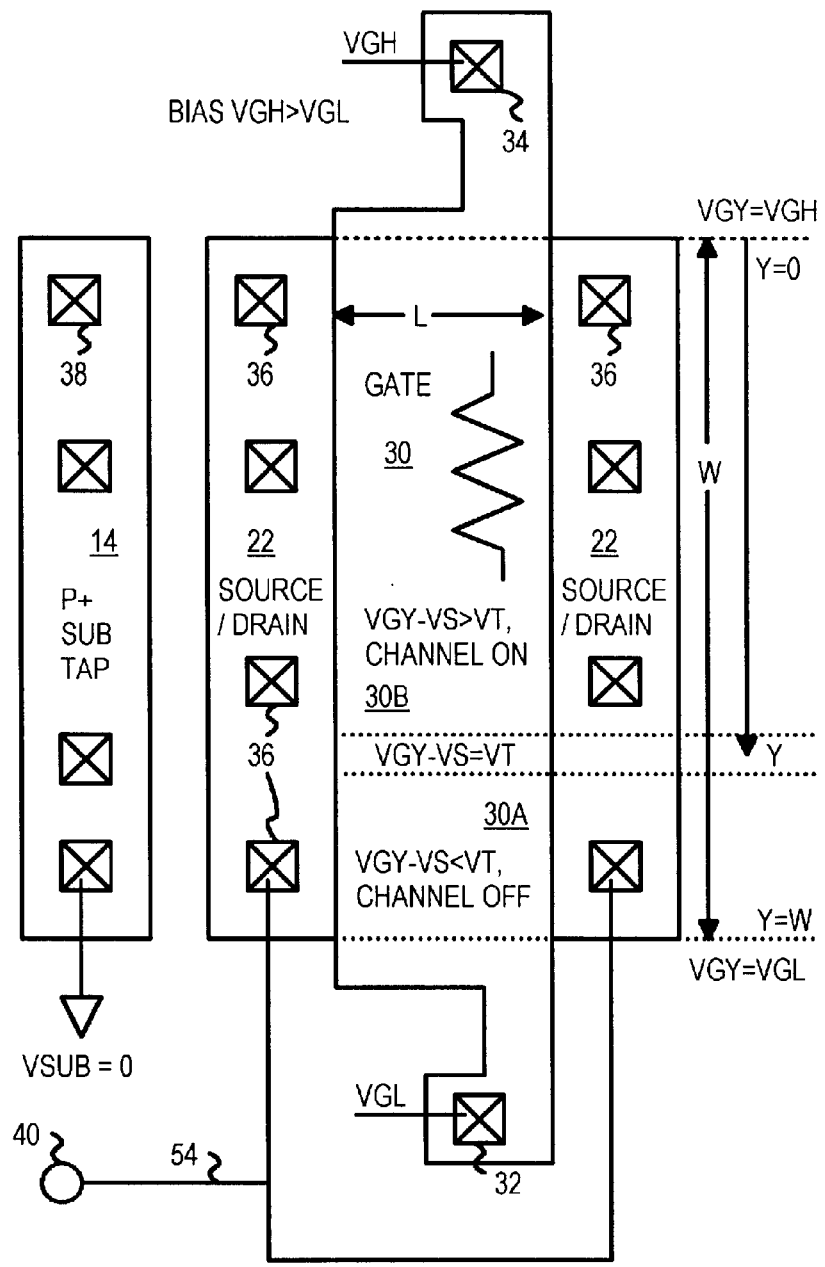
FIG. 3 shows a MOS-transistor gated diode operating as a variable capacitor.

MOS Gated Diode as Variable Capacitor—FIG. 3

FIG. 3 shows a MOS-transistor gated diode operating as a variable capacitor. This is a layout or overhead view showing the gate, substrate, and contact layers.

Traditionally, the same voltage is applied to all contacts of the gate. Instead, the inventor applies different voltages to the ends of gate 30. An upper voltage VGH is applied to upper contact 34, while a lower voltage VGL is applied to contact 32. Upper contact 34 connects to a metal line, which is biased to voltage VGH by a bias circuit (not shown). Lower contact 32 connects to another metal line, which is biased to lower voltage VGL by another bias circuit.

A voltage gradient or differential of VGH-VGL is thus applied across gate 30. A current flows from upper contact 34 to lower contact 32 through gate 30, which acts as a resistor.

The size of the transistor is defined by the width W and length L of gate 30. The channel length L is the direction of normal transistor current flow under gate 30, while the width W is the direction perpendicular to current flow in a normal transistor.

The total capacitance of the varactor is the sum of the source-to-substrate junction capacitance, the drain-to-substrate junction capacitance, and the channel-to-substrate junction capacitance. The area of the source and drain junction capacitors are fixed and these components of the total capacitance vary with the source and substrate voltage difference. However, the area of the channel is a function of the gate, source, and drain voltages. When the transistor is biased in an off condition, no conducting channel forms in the substrate under gate 30, and the channel-to-substrate capacitance is near zero, being only the parasitic and fringe capacitances. The full channel-to-substrate capacitance is available when the channel is fully formed.

Gate Voltage Varies Along W Direction

However, when a voltage difference is applied across the gate 30, the voltage under gate 30 is not constant. Instead, the voltage under gate 30 varies as a function of distance between contacts 34, 32. For portions of gate 30 that are near upper contact 34, the gate voltage is near VGH. Portions of gate 30 near lower contact 32 have gate voltages near VGL. The middle of gate 30, halfway between contacts 34, 32, has a gate voltage halfway between VGH and VGL, such as (VGH-VGL)/2 when the transistor is off.

The source and drain regions 22 are connected by source contacts 36 to line 54, which is biased to a source voltage VS that can vary somewhat but can be considered constant for purposes of analysis. For a basic understanding of the operation of the variable capacitor, assume that VS is constant, or changes very slowly so that it can be considered constant at a point in time. The same source voltage VS is applied to all parts of source and drain regions 22 by contacts 36 to metal lines (not shown) that are connected to line 54.

Since the source voltage does not vary along the W direction of gate 30, but the gate voltage does, the gate-to-source voltage Vgs also varies along the W direction. For certain biasing conditions, the gate-to-source voltage can be above the threshold near upper contact 34, but below the threshold near lower contact 32. The lower portion 30A of gate 30 near lower contact 32 is turned off, since the gate-to-source voltage is below the threshold required to turn on the conducting channel under gate 30 VG(Y)−VS= Vgs<Vth).

However, the upper portion or region 30B of gate 30 near upper contact 34 is turned on, since the gate-to-source voltage is above the threshold required to turn on the conducting channel in the substrate under gate 30 (VG(Y)− VS=Vgs>Vth). At a location where VG(Y)−VS is exactly equal to threshold Vth, the channel just starts to form. This is shown as a dotted-line region between lower region 30A (transistor off) and upper region 30B (transistor on).

The variable Y is the distance from upper contact 34. Y is 0 near upper contact 34, but is W near lower contact 32. This simplified analysis assumes that upper contact 34 and lower contact 32 are at the ends of the active region under gate 30. In an actual device, there is a slight voltage drop from upper contact 34 to the upper edge of gate 30, and another voltage drop from the lower edge of gate 30 to lower contact 32. These parasitic voltage drops can be decreased by using wider and shorter polysilicon tabs to contacts 32, 34.

The channel-to-substrate capacitance is proportional to the integral of the channel-to-substrate capacitance along the Y (W) direction. The approximate capacitance is the channel-to-substrate capacitance of upper region 30B, which is proportional to the area L*YT, where YT is Y where VG(Y)−VS=Vth.

Capacitance Varies with Applied Voltages

The capacitance can be varied by adjusting the biasing conditions. The source voltage VS can be lowered to make more values of Y have gate-to-source voltages over the threshold, thus increasing the area of turned-on upper region 30B. Increasing source voltage VS moves the threshold point YT higher, reducing the area of turned-on upper region 30B and thus lowering capacitance. The capacitance therefore varies with source voltage VS. Since the capacitance varies with source voltage VS, the device is a voltage-variable capacitor, or varactor.

The capacitance also varies with the gate voltages. When VGH or VGL is raised, higher gate voltages occur everywhere, thus increasing the area of turned-on upper region 30B, and increasing the capacitance.

Substrate tap 14 is a P+ region that makes electrical contact with the p-type substrate under gate 30 and source/drain regions 22. Contacts 38 can be connected to a substrate-bias voltage, such as ground.

While the capacitance from the gate to the channel varies with gate and source voltages, the variable capacitor uses the channel-to-substrate capacitance, rather than the gate-to-channel capacitance. However, the channel-to-substrate capacitance is a function of the size of the channel, and thus also varies with gate voltages VGL, VGH and source voltage VS. The device can be connected as a variable capacitor to an external circuit by connecting the external circuit between terminal 40 of line 54 and the substrate. Since the substrate is often grounded, the external circuit can simply connect to line 54, and have a variable capacitance to ground.

Figure 4:
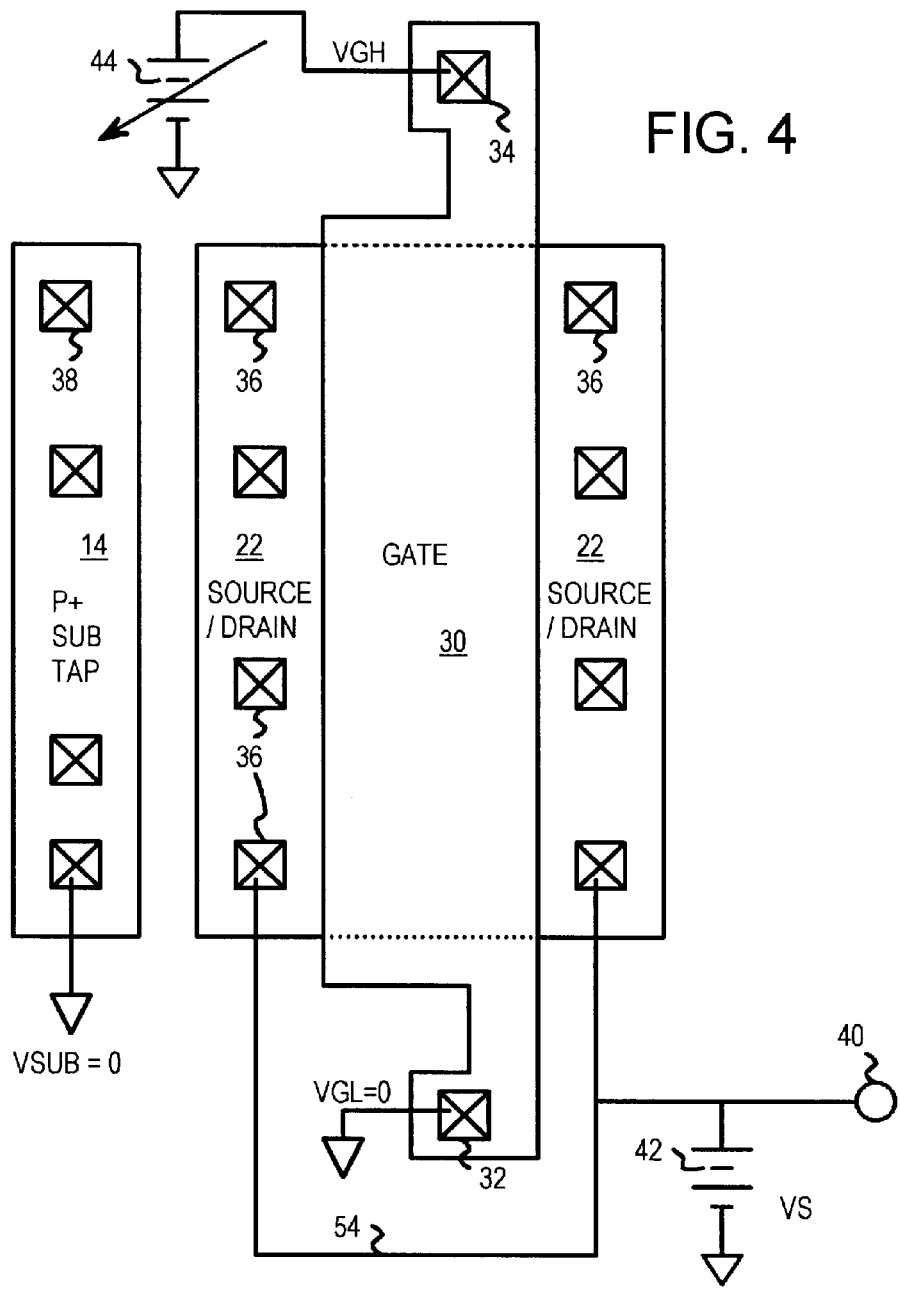
FIG. 4 shows grounded-lower-gate biasing of the varactor.

Grounded Lower Contact—FIG. 4

FIG. 4 shows grounded-lower-gate biasing of the varactor. In this embodiment, the same physical transistor structure can be used as shown for FIG. 3. The substrate is biased to ground by contacts 38 in substrate tap 14. Lower gate voltage VGL is grounded, while upper gate voltage VGH is above ground.

Lower contact 32 of gate 30 is grounded, while upper contact 34 is connected to variable voltage source 44 by a metal line. Variable voltage source 44 could be a variable-voltage generated from a battery and a variable resistor, or by some other voltage-generating circuit. For example, a digital-to-analog converter (DAC) could receive a binary code and convert it to variable voltage VGH.

Source/drain regions 22 are biased with voltage VS through contacts 36. The source voltage VS can be generated by an applied voltage from external battery 42, or from a bias-voltage generator such as a voltage divider or band-gap voltage reference. The source voltage VS could also be generated by an external circuit that uses the device as a variable capacitor. In that case, external battery 42 is not needed and can be deleted.

The capacitance from the channel to the substrate is varied as the area of the channel is changed by the adjustable upper gate voltage VGH. The channel is electrically connected to drain/drain regions 22. The variable capacitance is provided to another circuit (not shown) by terminal 40 attached by line 54 to source/drain regions 22. The circuit sees a variable capacitor between terminal 40 and ground. The value of the capacitance is adjusted by varying the upper gate voltage VGH using variable voltage source 44. In another embodiment, VGH is fixed while VS is the variable voltage.

Figure 5:
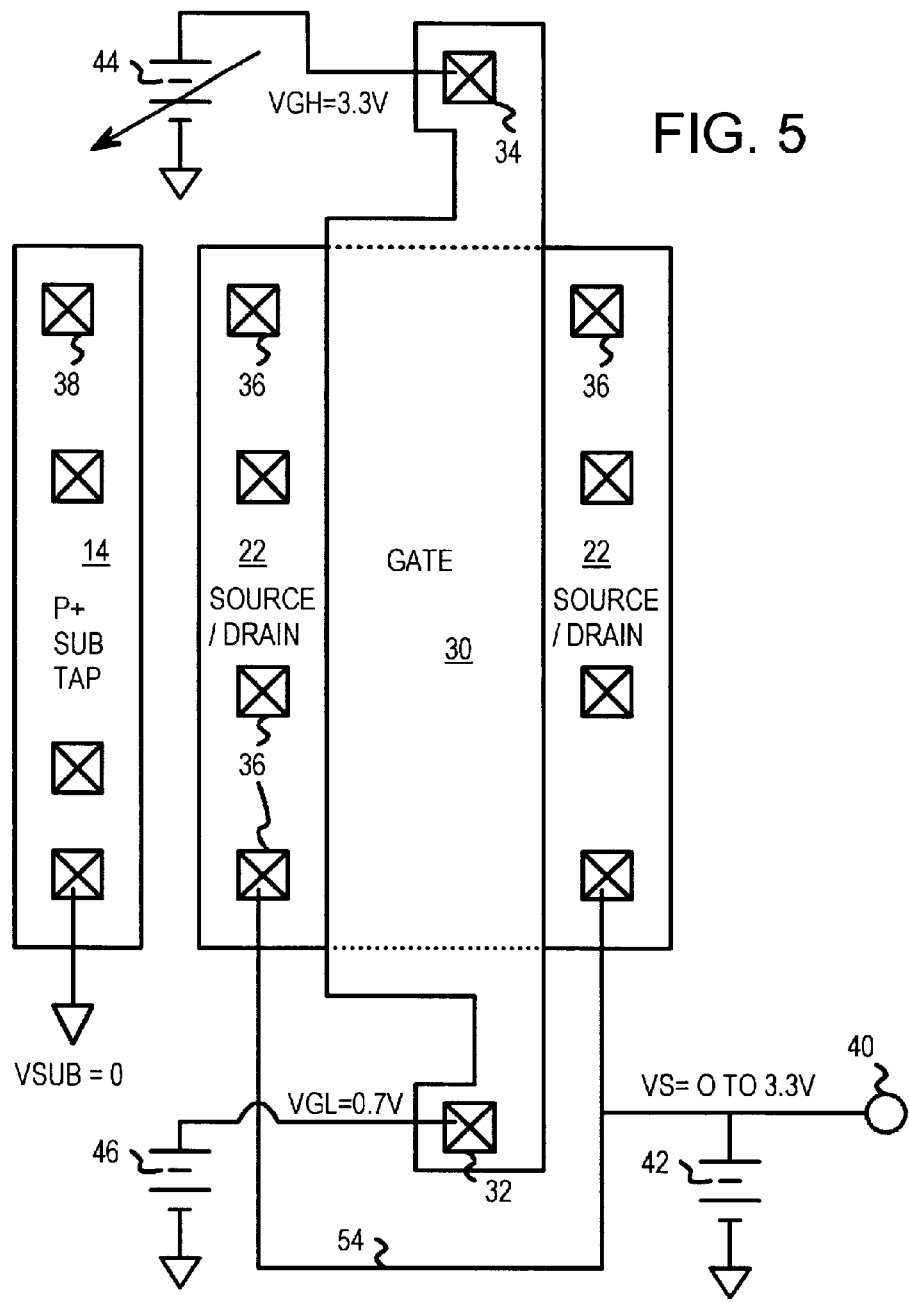
FIG. 5 shows above-ground lower-gate biasing of the varactor.

Lower Gate Contact Above Ground—FIG. 5

FIG. 5 shows above-ground lower-gate biasing of the varactor. In this embodiment, the same physical transistor structure can be used as shown for FIG. 3. The substrate is biased to ground by contacts 38 in substrate tap 14. Source/drain regions 22 are biased with voltage VS through contacts 36. Lower gate voltage VGL is biased above ground, while upper gate voltage VGH is above ground and above VGL. Upper contact 34 is connected to variable voltage source 44 by a metal line.

Since the transistor threshold voltage Vth is typically above ground, the size of the turned-off lower region of gate 30 is always non-zero when lower contact 32 is grounded. Since this turned-off region does not contribute to the capacitance, it is a wasted area. Since a typical transistor threshold voltage Vth is 0.5 to 0.7 volt, a significant part of gate 30 may be below threshold and off, even when upper gate voltage VGH is raised.

To reduce the size of the turned-off region under gate 30, lower gate voltage VGL can be biased above ground to near the threshold voltage. External bias 46 generates a bias voltage of about the threshold voltage, or 0.7 volt, to apply to lower contact 32. This external bias 46 could be generated by an on-chip bias-voltage generator or voltage divider, or could be generated by an external battery or power source, or could be a resistor between lower contact 32 and ground.

The source voltage VS could be varied by adjusting the voltage of external battery 42 or using an adjustable bias generator. The value of source voltage VS can be a voltage from ground to the power-supply voltage, when the upper gate voltage VGH is connected to the power supply, such as 3.3 volts. However, when the source voltage VS is above VGH, no channel is formed and the variable capacitor stops operating as desired.

Figure 6:
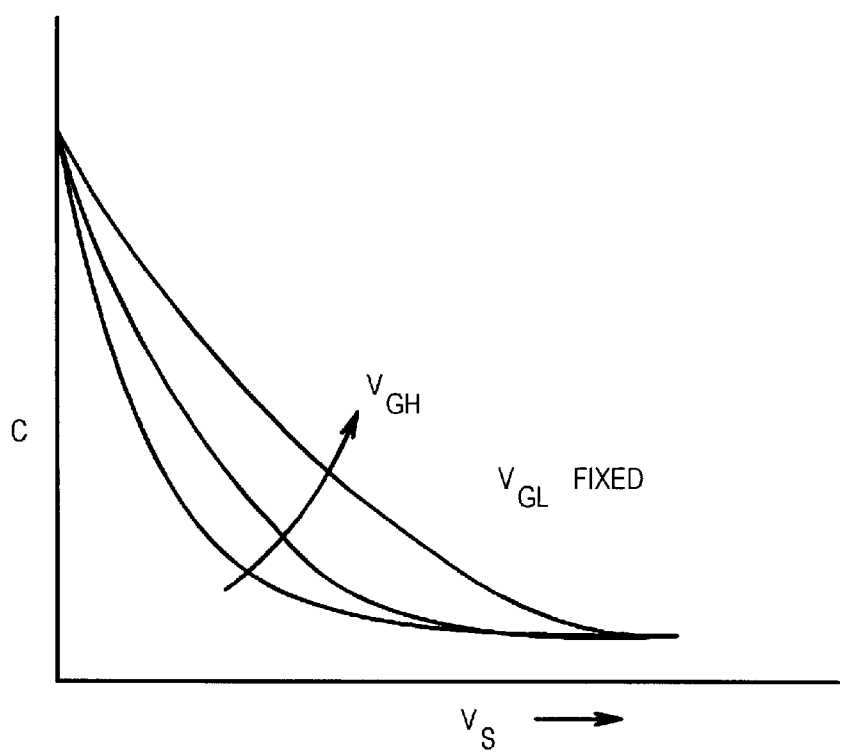
FIG. 6 is a graph showing variation of capacitance with source and gate voltages.

FIG. 6 is a graph showing variation of capacitance with source and gate voltages. The lower gate voltage VGL is fixed. As upper gate voltage VGH is raised with the transistor on, the channel-to-substrate capacitance increases as a larger channel is formed. The increase in capacitance is linear with gate voltage above threshold, since more and more of the gate is turned on as the gate-to-source voltages are raised. This capacitance includes the source-to-substrate and drain-to-substrate capacitances as well as the channel-to-substrate capacitance under the gate. The turned-on upper region 30B is enlarged as the threshold point YT moves downward with the increase in gate voltage. Higher source voltages decreases the gate-to-source voltages and thus reduces the area of the channel, reducing capacitance.

Figure 7:
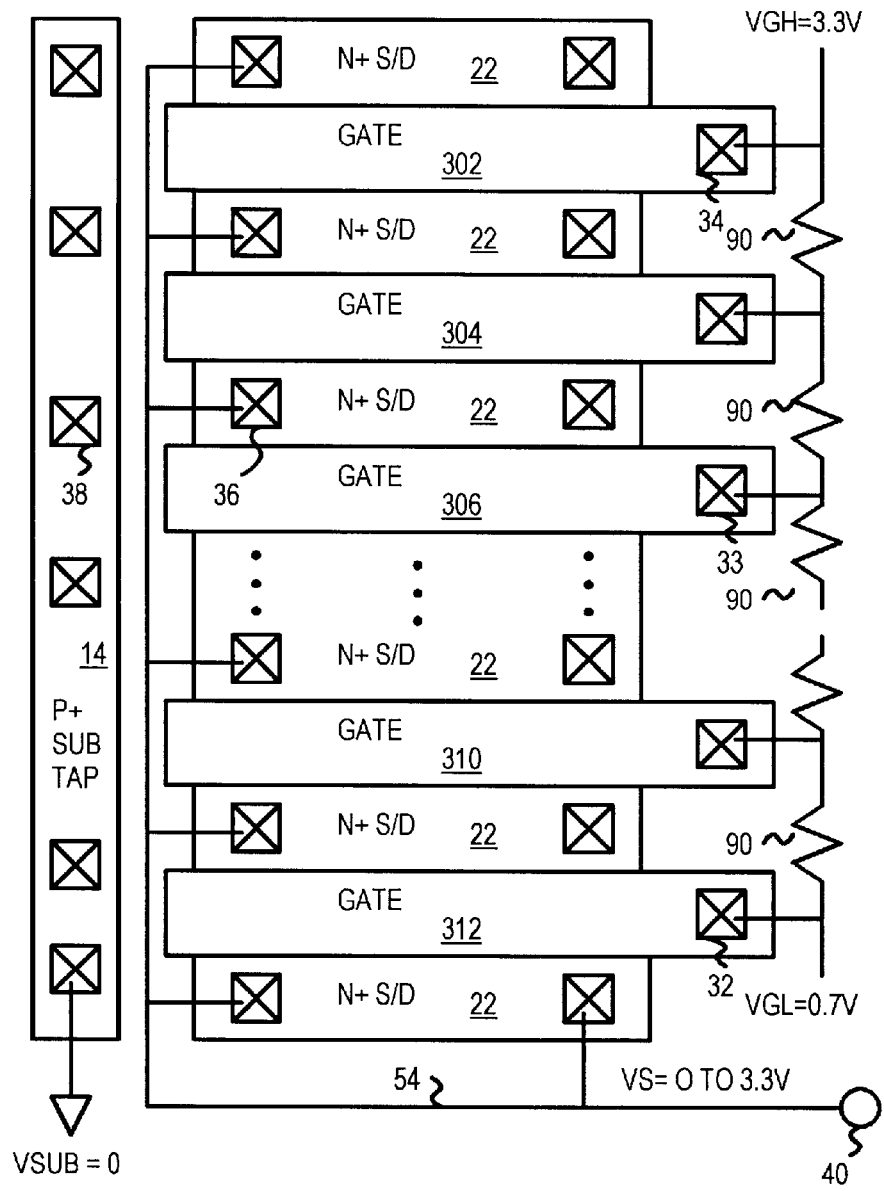
FIG. 7 is a low-current embodiment of the voltage-variable capacitor.

Low-Current Capacitor—FIG. 7

FIG. 7 is a low-current embodiment of the voltage-variable capacitor. A disadvantage of the embodiments of FIGS. 3–5 is that current flows from upper contact 34 to lower contact 32 through the resistor of gate 30, For example, a 100-ohm gate resistance draws a current of 10 mA when VGH is 1 volt. The current can be reduced by using a longer, narrower gate. A 3 by 300 micron gate has 100 squares, or 2K-ohm resistance. A VGH of 1 volt then draws only 0.5 mA. Thus the current through the gate can be reduced by layout.

The gate current can be reduced by dividing the gate into several arms separated by source/drain regions 22. The gate is divided into separate gate arms 302, 304, 306, 310, 312, each having a contact 34, 33, 32 to a different bias voltage.

All gate arms can be formed in the same thin-oxide or diffusion area as source and drain regions 22. All gate arms 302, 304, 306, 310, 312 can be formed from the same polysilicon or other gate material and are connected to metal lines by contacts 32, 33, 34, which are over field oxide. Alternatively, contacts 32–34 can be eliminated by forming resistors 90 out of polysilicon, and using polysilicon to connect gate arms 203–312 to resistors 90 or to voltage biases generated in some other manner.

Each of the gate arms 302–312 has a bias voltage applied. The bias voltages are stepped in increments between the lower gate voltage VGL and the upper gate voltage VGH. Upper gate arm 302 is connected to VGH by upper contact 34, while lower gate arm 312 is connected to VHL by lower contact 32.

Intermediate gate arms are biased to intermediate voltages V1, V2, V3, V4 . . . These intermediate voltages can be in equal steps or divisions of the overall voltage difference VGH-VGL. For an example with 4 intermediate voltages V1–V4 (six gate arms including the upper and lower arms) there are 5 increments. Each increment can be one-fifth of VGH-VGL. For example, when VGH is 2.0 volts and VGL is 0 volts, V1 is 0.4 volt, V2 is 0.8 volt, V3 is 1.2 volt, and V4 is 1.6 volt.

A voltage divider with many outputs, such as is formed by resistors 90 between VGH and VGL, or other voltage generators could be used to generate the intermediate voltages from VGH and VGL. While the voltage divider might draw some current, it can be designed to minimize current while still generating the intermediate voltages. Since each gate arm is separated from adjacent gate arms, there is no D.C. current path from VGH to VGL through the gates. Each gate arm is biased to a static voltage with little or no current loss.

Non-equal increments could also be substituted to vary the slope of the dC/dV curve, and the width or length of each arm could be varied, as could the number of arms. Many more arms could be used for smother capacitance adjustments.

Source/drain regions 22 are connected together by source contacts 36. Both the source and drain are connected by contacts 36 to line 54, which is connected to capacitor terminal 40. The source voltage VS can be applied by the external circuit, or by a bias generator or battery. Since both the drain and the source are biased to the same voltage, no drain-to-source current flows.

The capacitance seen at terminal 40 is adjusted by adjusting the upper gate bias VGH. Increasing VGH increases the gate-to-source voltage for all gate arms, causing more arms to exceed the transistor threshold and turn on. With more of the gate arms turned on with a conducting channel under their gate regions, the overall channel-to-substrate capacitance of the variable capacitor increases with gate voltage VGH. The lower gate voltage VGL could also be varied.

The capacitance may increase in discrete steps as the gate voltage is increased more than a threshold above the source voltage of the next gate arm, turning its channel on. The dC/dV curve may show steps rather than a smooth curve. This can be an advantage for some applications. For example, the circuit attached to terminal 40 may have an A.C. component that is applied to terminal 40. This A.C component can add voltage variations to source voltage VS. If these variations are less than the voltage required to turn on the next arm, or turn off the uppermost arm that is on, then the A.C. variations do not change the capacitance. For the embodiment of FIG. 4, these small A.C. variations do change the capacitance as the size of the channel is varied by the A.C. variations. Thus using discrete capacitance steps provides a more stable capacitance that is still adjustable. For an embodiment with many gate arms, such as 50 gate arms, the discrete steps may merge into a smooth curve.

Figure 8:
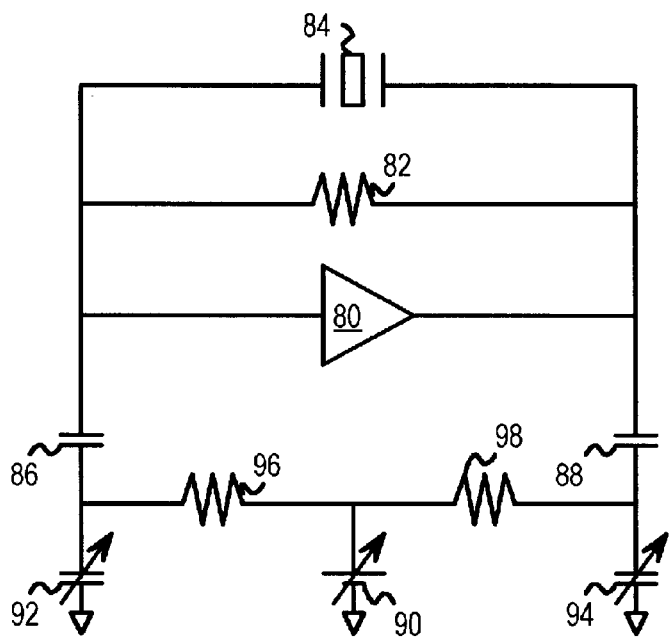
FIG. 8 shows the use of the variable capacitor in a voltage-controlled crystal oscillator circuit.
Figure 9:
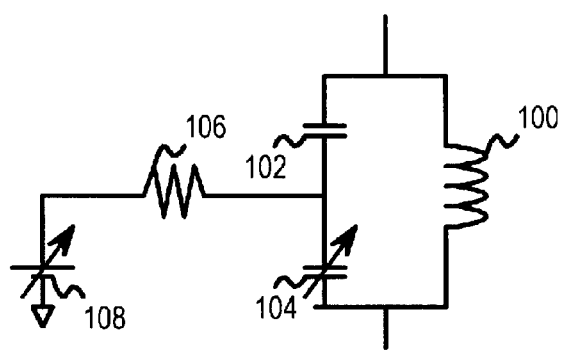
FIG. 9 shows the use of the variable capacitor in a L-C tuning or tank circuit.

Use of Varactor in Circuits—FIGS. 8, 9

FIG. 8 shows the use of the variable capacitor in a voltage-controlled crystal oscillator circuit. Crystal 84 oscillates at a certain frequency. Amplifier 80 and resistor 82 provide feedback across the terminals of crystal 84 to induce oscillation. Battery 91 or another voltage source provides a gate bias voltage VGH to variable capacitors 92, 94 through resistors 96, 98, respectively. The bias from battery 91 can be adjusted to vary the source and drain bias of variable capacitors 92, 94, thus adjusting their capacitances. Fixed capacitors 86, 88 couple variable capacitors 92, 94 to the terminals of crystal 84. This embodiment shows a common Pierce series crystal oscillator. Feedback resistor 82 keeps amplifier 80 in a high gain region. Amplifier 80 provides sufficient gain while the two capacitors 92 and 94 together with amplifier 80 shift phase enough to get positive feedback through crystal. When the values of variable capacitors 92 and 94 change, the phase shift due to these changes causes the crystal to change the frequency to match the phase shift, producing positive feedback.

Variable capacitors 92, 94 can be similar to the embodiment shown in FIG. 4, except that the source/drain voltage rather than the gate node is voltage-adjusted to adjust the capacitance. The terminals of the variable capacitor are ground and the source/drain node (terminal 40). The source and drain node of each variable capacitor 92, 94 is connected to the adjustable gate bias of battery 91 through resistors 96, 98. The capacitance of variable capacitor 92 in series with capacitor 96 is thus adjusted by battery 91. Likewise, the capacitance of variable capacitor 94 in series with capacitor 98 is also adjusted by battery 91.

FIG. 9 shows the use of the variable capacitor in a L-C tuning or tank circuit. Inductor 100 is in parallel with a series capacitance of fixed capacitor 102 and variable capacitor 104. The resonant frequency across inductor 100 is tunable by adjusting the capacitance of variable capacitor 104.

Adjustable voltage source 108 applies a gate bias voltage VGH to variable capacitor 104 through resistor 106. This bias voltage VGH adjusts the capacitance of variable capacitor 104. Variable capacitor 104 can be the variable capacitor shown in FIG. 4, where the adjustable bias voltage is applied to the upper gate contact.

ALTERNATE EMBODIMENTS

Several other embodiments are contemplated by the inventor. For example the substrate could be biased by a charge pump to a voltage other than ground. The external circuit uses the variable capacitor by connecting between line 54 and this substrate voltage. For example, the substrate could be biased to −3 volts, and the variable capacitor has a lower terminal at −3 volts. In an actual device layout, the source side can be used by itself without a drain side, or vice-versa. Using many metal contacts reduces resistance, but is not essential.

The terms source and drain are often used interchangeably, as a source/drain region can function as a source or a drain depending on the applied bias voltages. The source and drain regions do not have to have identical layouts or identical voltages. The drain can be biased to different voltages, although some current can flow from drain to source when the source and drain voltages are not equal. The variable capacitor could have only a source and no drain, such as by having the gate extend to field oxide where the drain would be. The drain could also be left floating, or the source and drain could be connected together by a diffusion link rather than a metal link. A p-channel transistor rather than an n-channel transistor could be substituted with appropriate changes in biases.

Many second-order effects can be taken into account using computer simulations, such as a variation of threshold Vth with source voltage (body effect), sub-threshold channel capacitance near Vth, current crowding around the edges of the source and drain regions, fringe capacitances, source-to-substrate and drain-to-substrate parasitic capacitances, and contact placement and resistances at the ends of the gate before beyond the contacts. The exact capacitance values can also be determined empirically by simply building one or more varactors, perhaps with different geometries, and measuring its capacitance for various biasing conditions. Another way of adjusting the C-V curve is by adjusting the relative resistance value of resistors between gate arms.

The external circuit using the variable capacitor can be integrated on the same chip with the variable capacitor, or it can be on a different chip. The physical layout ordering of the gate arms does not have to follow the bias order. The gate arms can be arranged in any order, including random. Separate P+ substrate taps 14 could be used rather than an elongated tap as shown.

Other insulators besides field oxide can be used, such as trench isolation or silicon-on-insulator or non-silicon materials. Special processing steps can be eliminated since the variable capacitor is formed using standard transistor processing steps.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A varactor comprising:

a metal-oxide-semiconductor (MOS) gated diode having a gate, a source, and a substrate;

wherein the gate also comprises a gate resistor between an upper-gate contact and a lower-gate contact;

an upper voltage applied to the upper-gate contact;

a lower voltage applied to the lower-gate contact;

wherein the upper voltage and the lower voltage are not equal, causing a gate current to flow through the gate resistor and producing a voltage gradient along the gate wherein gate-to-source voltages vary along the voltage gradient;

a first capacitor terminal, connected to the source and having a source voltage, the source voltage sufficient to cause formation of an inversion layer under a first portion of the gate but insufficient to cause formation of an inversion layer under all of the gate;

wherein the inversion layer is electrically coupled to the source;

a second capacitor terminal connected to a substrate under the inversion layer; and a drain alongside the gate, and coupled to the first capacitor terminal;

wherein the drain and source and both biased to the source voltage, whereby capacitance between the first and second capacitor terminals is varied by enlarging or reducing an area of the first portion.

2. The varactor of claim 1 further comprising:

an adjustable bias generator for adjusting the upper voltage applied to the upper-gate contact;

a ground connection for connecting the substrate and the second capacitor terminal to a ground;

wherein the upper voltage is increased to enlarge the first portion and to increase capacitance but the upper voltage is decreased to decrease the first portion and to reduce capacitance, whereby capacitance is adjusted by adjusting the upper voltage.

3. The varactor of claim 1 wherein the upper voltage is adjusted to adjust capacitance, while the lower voltage is a fixed voltage.

4. The varactor of claim 3 wherein the lower voltage and the second capacitor terminal are coupled to ground.

5. The varactor of claim 4 wherein capacitance between the first and second capacitor terminals includes a source-to-substrate capacitance that does not vary with gate voltage, and an inversion-layer-to-substrate capacitance that varies with gate voltage.

6. The varactor of claim 1 wherein the gate, source, and drain form an n-channel metal-oxide-semiconductor transistor.

7. The varactor of claim 1 further comprising:

source contacts, located in the source, for connecting the source to a metal line;

drain contacts, located in the drain, for connecting the drain to the metal line;

wherein the metal line is connected to the first capacitor terminal.

8. The varactor of claim 1 wherein the gate comprises a plurality of gate arms biased to different voltages between the upper voltage and the lower voltage, the gate arms being electrically isolated from one another wherein gate current flow is blocked by electrical isolation of the gate arms.

* * * * *